United States Patent
Parris et al.

(10) Patent No.: US 7,053,692 B2
(45) Date of Patent: May 30, 2006

(54) POWERGATE CONTROL USING BOOSTED AND NEGATIVE VOLTAGES

(75) Inventors: Michael C. Parris, Colorado Springs, CO (US); Kim C. Hardee, Colorodo Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 0 days.

(21) Appl. No.: 10/325,524

(22) Filed: Dec. 19, 2002

(65) Prior Publication Data

US 2004/0119529 A1    Jun. 24, 2004

(51) Int. Cl.
*G05F 3/02* (2006.01)

(52) U.S. Cl. ............... 327/427; 327/530; 327/544

(58) Field of Classification Search ............ 327/390, 327/536, 589, 374–377, 530, 383, 427, 544; 363/59; 326/63, 80, 82
See application file for complete search history.

(56) References Cited

U.S. PATENT DOCUMENTS

| | | | | |
|---|---|---|---|---|
| 4,603,269 A | * | 7/1986 | Hochstein | 327/432 |
| 5,134,322 A | * | 7/1992 | Bourgeois et al. | 327/381 |
| 5,155,573 A | * | 10/1992 | Abe et al. | 257/304 |
| 5,325,258 A | * | 6/1994 | Choi et al. | 327/427 |
| 5,493,245 A | * | 2/1996 | Kao et al. | 327/333 |
| 5,506,535 A | * | 4/1996 | Ratner | 327/333 |
| 5,594,380 A | * | 1/1997 | Nam | 327/390 |
| 5,729,165 A | * | 3/1998 | Lou et al. | 327/112 |
| 5,821,771 A | * | 10/1998 | Patel et al. | 326/38 |
| 5,973,552 A | | 10/1999 | Allan | |
| 6,031,778 A | * | 2/2000 | Makino et al. | 365/226 |
| 6,049,245 A | * | 4/2000 | Son et al. | 327/544 |
| 6,072,353 A | * | 6/2000 | Matsuzawa | 327/390 |
| 6,072,354 A | * | 6/2000 | Tachibana et al. | 327/390 |
| 6,118,328 A | * | 9/2000 | Morikawa | 327/534 |
| 6,169,419 B1 | | 1/2001 | De et al. | |
| 6,215,329 B1 | * | 4/2001 | Campardo et al. | 326/88 |
| 6,239,614 B1 | * | 5/2001 | Morikawa | 326/39 |
| 6,242,973 B1 | * | 6/2001 | Kong et al. | 327/589 |
| 6,337,593 B1 | * | 1/2002 | Mizuno et al. | 327/534 |
| 6,433,584 B1 | * | 8/2002 | Hatae | 327/544 |
| 6,483,374 B1 | * | 11/2002 | Mizuno et al. | 327/534 |
| 6,535,021 B1 | * | 3/2003 | Song | 326/121 |
| 6,635,934 B1 | * | 10/2003 | Hidaka | 327/546 |
| 6,636,103 B1 | * | 10/2003 | Wurcer et al. | 327/536 |
| 6,700,433 B1 | * | 3/2004 | Zuk | 327/427 |
| 2003/0071681 A1 | * | 4/2003 | Fujimori | 327/544 |
| 2003/0102904 A1 | * | 6/2003 | Mizuno et al. | 327/544 |
| 2003/0197544 A1 | * | 10/2003 | Burr | 327/427 |
| 2004/0080340 A1 | * | 4/2004 | Hidaka | 326/83 |
| 2005/0052936 A1 | * | 3/2005 | Hardee | 365/230.06 |

* cited by examiner

*Primary Examiner*—Terry D. Cunningham
(74) *Attorney, Agent, or Firm*—Peter J. Meza; William J. Kubida; Hogan & Hartson LLP

(57) ABSTRACT

A powergating circuit includes an MOS circuit such as a memory circuit having a first power terminal and a second power terminal, a P-channel transistor having a drain coupled to the first power terminal of the MOS circuit, and an N-channel transistor having a drain coupled to the second power terminal of the MOS circuit. In order to minimize leakage current and resultant power dissipation a negative $V_{GS}$ voltage is established in the transistors during a standby mode and a boosted $V_{GS}$ voltage is established in the transistors during an active mode.

1 Claim, 2 Drawing Sheets

POWERGATE CONTROL USING BOOSTED AND NEGATIVE VOLTAGES

BACKGROUND OF THE INVENTION

The present invention relates, in general, to the field of integrated circuit ("IC" or "chip") devices. More particularly, the present invention relates to a circuit and a corresponding method of operation for limiting undesirable leakage current in a standby mode.

Powergating logic and decoding functions is a way to decrease the leakage current of turned-off transistors during standby for memory and other types of integrated circuits. By inserting a transistor in series with the power supply or ground or both and turning off this transistor during standby, power can be conserved. Powergating transistors, however, are large and can be leaky in prior art circuits. With today's high speed, low supply voltage products, leakage or off current and corresponding power consumption is becoming a significant factor. This problem is even more pronounced when a battery is used in, for example, wireless or portable applications.

Previous designs have taken the control gate of these powergating transistors to a level beyond the power supply voltage so that a negative VGS develops and the leakage is reduced further during standby.

Referring now to FIG. 1, three typical prior art powergated MOS circuits 10, 20, and 30 are shown. Circuit 10 includes a single P-channel transistor 12 in series with a typical MOS circuit 14, such as a memory IC or the peripheral logic circuit of a memory IC. The gate of P-channel transistor 12 is designated node "A". Circuit 20 includes a single N-channel transistor 16 in series with MOS circuit 14. The gate of N-channel transistor 16 is designated node "B". Circuit 30 includes both P-channel transistor 12 and N-channel transistor 16 in series with MOS circuit 14.

Referring now to FIG. 2, a first prior art method for operating powergated circuits 10, 20, and 30 is shown. The waveforms on nodes A and B are shown for each of circuits 10, 20 and 30. Circuit 10 uses waveform A, circuit 20 uses waveform B, and circuit 30 uses both waveforms A and B. Each of nodes A and B transition from an active mode to the standby mode, and back to the active mode. Node A is low (ground) and node B is high (VDD power supply voltage) during the active mode. To transition into the standby mode, node A is taken high (VDD power supply voltage) and node B is taken low (ground). The initial conditions are reasserted to transition back to the active mode. While the first prior art control levels shown in FIG. 2 significantly reduce the standby or leakage current of MOS circuit 14, the leakage current can be reduced still further.

Referring now to FIG. 3, a second prior art method for operating powergated circuits 10, 20, and 30 is shown. Node A is low (ground) and node B is high (VDD power supply voltage) during the active mode. To transition into the standby mode, node A is taken high (VDD power supply voltage+delta voltage) and node B is taken low (ground–delta voltage). The initial conditions are reasserted to transition back to the active mode. The second prior art control levels shown in FIG. 3 further reduce the standby or leakage current of MOS circuit 14 by establishing a negative VGS on transistors 12 and 16, but only in the standby mode.

What is desired is a further refinement in the manner of operating powergating circuits such that leakage current can be still further reduced.

SUMMARY OF THE INVENTION

In a first embodiment, a powergating circuit according to the present invention includes comprising an MOS circuit such as a memory circuit or other integrated circuit having a first power terminal and a second power terminal coupled to ground and a P-channel transistor having a source coupled to a $V_{DD}$ source of supply voltage, a drain coupled to the first power terminal of the MOS circuit, and a gate for receiving a control voltage for establishing a negative $V_{GS}$ voltage in a standby mode and a boosted $V_{GS}$ voltage in an active mode. The control voltage is a voltage greater than $V_{DD}$ in the standby mode, and is a voltage less than ground in the active mode. The P-channel transistor is a reduced-width P-channel transistor compared to a non-boosted P-channel transistor. Under typical operating conditions, the P-channel transistor width is reduced by a factor of about two.

In a second embodiment, a powergating circuit according to the present invention includes an MOS circuit having a first power terminal coupled to a $V_{DD}$ source of supply voltage and a second power terminal and an N-channel transistor having a source coupled to ground, a drain coupled to the second power terminal of the MOS circuit, and a gate for receiving a control voltage for establishing a negative $V_{GS}$ voltage in a standby mode and a boosted $V_{GS}$ voltage in an active mode. The control voltage is a voltage greater than $V_{DD}$ in the active mode, and is a voltage less than ground in the standby mode. The N-channel transistor is a reduced-width N-channel transistor compared to a non-boosted N-channel transistor. Under typical operating conditions, the N-channel transistor width is reduced by a factor of about one and one-half.

In a third embodiment, a powergating circuit according to the present invention includes an MOS circuit having a first power terminal and a second power terminal, a P-channel transistor having a source coupled to a $V_{DD}$ source of supply voltage, a drain coupled to the first power terminal of the MOS circuit, and a gate for receiving a first control voltage for establishing a negative $V_{GS}$ voltage in a standby mode and a boosted $V_{GS}$ voltage in an active mode, and an N-channel transistor having a source coupled to ground, a drain coupled to the second power terminal of the MOS circuit, and a gate for receiving a second control voltage for establishing a negative $V_{GS}$ voltage in the standby mode and a boosted $V_{GS}$ voltage in the active mode. The first control voltage is a voltage greater than $V_{DD}$ in the standby mode and is a voltage less than ground in the active mode. The second control voltage is a voltage greater than $V_{DD}$ in the active mode and is a voltage less than ground in the standby mode. The reduction in width of the transistors is the same as in the first and second embodiments.

In a corresponding method of operation for a powergating circuit including an MOS circuit having a first power terminal and a second power terminal, a P-channel transistor having a drain coupled to the first power terminal of the MOS circuit, and an N-channel transistor having a drain coupled to the second power terminal of the MOS circuit, the method includes the steps of establishing a negative $V_{GS}$ voltage in at least one of the transistors in a standby mode and establishing a boosted $V_{GS}$ voltage in at least one of the transistors in an active mode. If desired, either of the powergating transistors can be eliminated and the corresponding power terminal of the MOS circuit can be coupled to either VDD or ground as appropriate.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
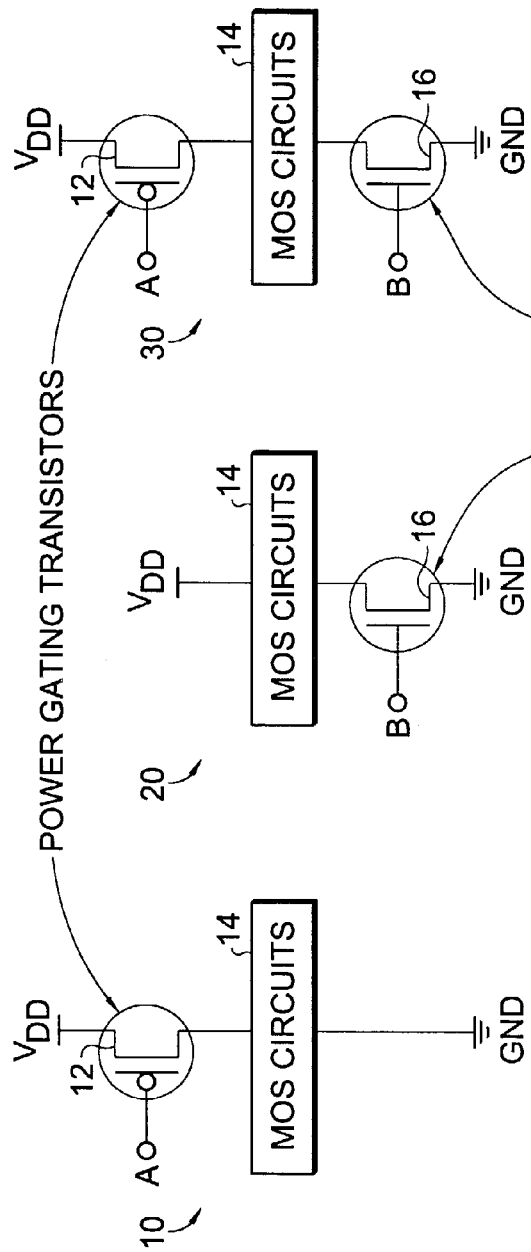
FIG. 1 is a circuit/block diagram of three powergating circuits that are operated according to the prior art control levels as shown in FIGS. 2 and 3.
Figure 2:
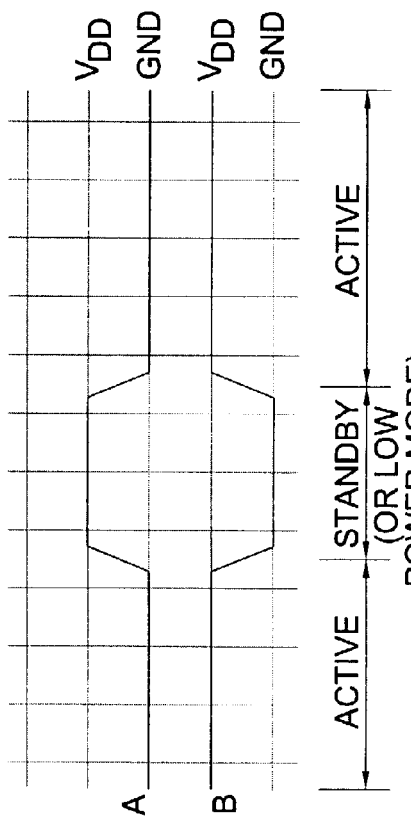
FIG. 2 is a timing diagram showing a first prior art technique for controlling the gates of the P-channel and/or N-channel gating transistors of the circuits shown in FIG. 1.
Figure 3:
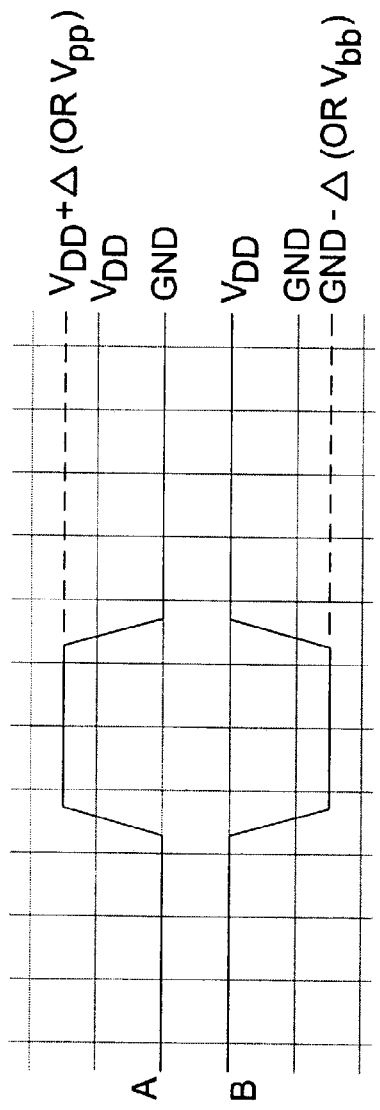
FIG. 3 is a timing diagram showing a second prior art technique for controlling the gates of the P-channel and/or N-channel gating transistors of the circuits shown in FIG. 1.
Figure 4:
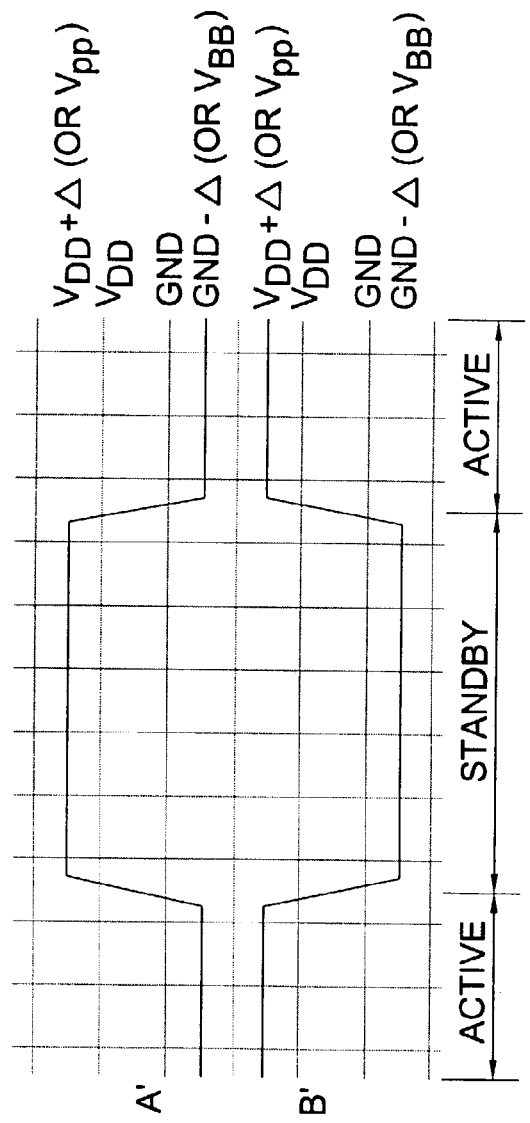
FIG. 4 is a timing diagram showing a technique for controlling the gates of the P-channel and/or N-channel gating transistors of the circuits shown in FIG. 1 according to the present invention.

Referring now to FIG. 4 a method for operating power-gated circuits 10, 20, and 30 according to the present invention is shown. Node A is low (ground–delta voltage or VBB power supply voltage) and node B is high (VDD power supply voltage+delta voltage or VPP power supply voltage) during the active mode (boosted VGS voltage). To transition into the standby mode, node A is taken high (VDD power supply voltage+delta voltage or VPP power supply voltage) and node B is taken low (ground–delta voltage or VBB power supply voltage). The initial conditions are reasserted to transition back to the active mode. The control levels shown in FIG. 4 still further reduce the standby or leakage current of MOS circuit 14 by establishing a boosted VGS voltage on transistors 12 and/or 16 during the active mode and by establishing a negative VGS voltage on transistors 12 and/or 16 in the standby mode.

An improvement has thus been made over prior art techniques by changing the control signal levels during the active time period as well as establishing a negative VGS voltage during the standby time period.

By boosting the voltage level of control signals A and B the powergating transistors can be made smaller than otherwise for the same IDS capability. By making the powergating transistors smaller, chip size can be saved and leakage during standby is reduced. Depending on the given technology (gate oxide thickness of the powergating transistors) the savings in chip size and reduction in power consumption can be large.

For example, on an advanced technology integrated circuit in which an internal 0.8 volt power supply was used, a delta voltage of 0.4 volt was implemented. The combination of a boosted and negative according to the present invention in this case reduced the width of the powergating transistors by 1.5 to 2.0 times for the N-channel and P-channel powergating transistors respectively. This resulted in a corresponding decrease in chip size, leakage current, and power dissipation during the standby mode.

While a significant improvement was achieved in the foregoing example, similar improvements can also be had when using more typical 5, 3.3, and 2.5 volt power supplies. Also, a delta voltage of 0.4 volts need not be used precisely, but can changed as required for a desired application. Additionally, the "delta" voltage need not be equal for both the negative and boosted $V_{GS}$ voltages. There can be a different "delta" voltage in each case as desired. The "delta" voltages can also be different for the P-channel and N-channel transistors as required.

In conclusion, the prior art improves leakage current during standby by boosting the voltage of the powergating transistor gates, while the circuit and method of the present invention also boosts the $V_{GS}$ voltage during the active mode that in turn reduces area and standby leakage current.

While there have been described above the principles of the present invention in conjunction with a specific circuit and timing implementation it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

The invention claimed is:

1. A method of operating a powergating circuit including an MOS circuit having a first power terminal and a second power terminal, a P-channel transistor having a drain coupled to the first power terminal of the MOS circuit, a source coupled to VDD, and a gate, and an N-channel transistor having a drain coupled to the second power terminal of the MOS circuit, a source coupled to ground, and a gate, the method comprising:
   establishing a gate voltage below ground in the N-channel transistor in a standby mode;
   establishing a gate voltage above VDD in the P-channel transistor in the standby mode;
   establishing a gate voltage above VDD in the N-channel transistor in the active mode; and
   establishing a gate voltage below ground in the P-channel transistor in the active mode.

* * * * *